United States Patent
Andreev et al.

(10) Patent No.: US 7,305,593 B2
(45) Date of Patent: Dec. 4, 2007

(54) MEMORY MAPPING FOR PARALLEL TURBO DECODING

(75) Inventors: Alexander E. Andreev, San Jose, CA (US); Anatoli A. Bolotov, Cupertino, CA (US); Ranko Scepanovic, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 471 days.

(21) Appl. No.: 10/648,038

(22) Filed: Aug. 26, 2003

(65) Prior Publication Data

US 2005/0050426 A1    Mar. 3, 2005

(51) Int. Cl.
*G06F 11/00* (2006.01)

(52) U.S. Cl. .................................. 714/701; 714/772
(58) Field of Classification Search ................ 714/786, 714/701, 772
See application file for complete search history.

(56) References Cited

U.S. PATENT DOCUMENTS

| | | | | |
|---|---|---|---|---|
| 4,023,023 | A * | 5/1977 | Bourrez et al. | 708/490 |
| 4,656,592 | A | 4/1987 | Spaanenburg et al. | 364/490 |
| 5,752,070 | A | 5/1998 | Martin et al. | 395/800.33 |
| 5,898,677 | A | 4/1999 | Deeley et al. | 370/276 |
| 5,950,220 | A * | 9/1999 | Quach | 711/5 |
| 6,152,613 | A | 11/2000 | Martin et al. | 395/800.33 |
| 6,603,412 | B2 * | 8/2003 | Gatherer et al. | 341/61 |
| 7,020,827 | B2 * | 3/2006 | Gatherer et al. | 714/786 |

OTHER PUBLICATIONS

U.S. Appl. No. 10/021,414, filed Oct. 30, 2001, Eneboe et al.
U.S. Appl. No. 10/299,270, filed Nov. 19, 2002, Andreev et al.
"On-chip Networks weighed as wiring alternative," by R. Wilson, Integrated System Design, Jun. 25, 2001, URL:http://www.eet.com/OEG20010625S0099.
"Configurable Computing," by J. Villasenor et al.; Scientific American, Jun. 1997, URL:http://sciam.com/0697issue/0697villasenor.html.
"Models of Computation, Exploring the Power of Computing" by John E. Savage, pp. 309-311, 1998.

* cited by examiner

*Primary Examiner*—Guy Lamarre
*Assistant Examiner*—Mujtaba K. Chaudry
(74) *Attorney, Agent, or Firm*—Westman, Champlin & Kelly (57) ABSTRACT

A routing multiplexer system provide p outputs based on a selected permutation of p inputs. Each of a plurality of modules has two inputs, two outputs and a control input and is arranged to supply signals at the two inputs to the two outputs in a direct or transposed order based on a value of a bit at the control input. A first p/2 group of the modules are coupled to the n inputs and a second p/2 group of the modules provide the n outputs. A plurality of control bit tables each contains a plurality of bits in an arrangement based on a respective permutation. The memory is responsive to a selected permutation to supply bits to the respective modules based on respective bit values of a respective control bit table, thereby establishing a selected and programmable permutation of the inputs to the outputs.

10 Claims, 6 Drawing Sheets

FIG. 5 — Graph G

FIG. 6 — Coloring of Vertices

FIG. 7

Graph G of Permutation P = 7,1,0,6,2,5,3,4

FIG. 8 — Cycles of G

FIG. 9 — Coloring of G Vertices

FIG. 10 — TABLE T

FIG. 11 — T FOR P

FIG. 12 — T FOR P

MEMORY MAPPING FOR PARALLEL TURBO DECODING

CROSS-REFERENCE TO RELATED APPLICATIONS

This application is related to application Ser. No. 10/299,270 filed Nov. 19, 2002 for "Decomposer for Parallel Turbo Decoding, Process and Integrated Circuit" by Alexander E. Andreev, Ranko Scepanovic and Vojislav Vukovic and assigned to the same assignee as the present invention, the disclosure of which is herein incorporated by reference.

FIELD OF THE INVENTION

This invention relates to circuits that map memories for parallel turbo decoding.

BACKGROUND OF THE INVENTION

Turbo code systems employ convolutional codes, which are generated by interleaving data. There are two types of turbo code systems: ones that use parallel concatenated convolutional codes, and ones that use serially concatenated convolutional codes. Data processing systems that employ parallel concatenated convolutional codes decode the codes in several stages. In a first stage, the original data (e.g. sequence of symbols) are processed, and in a second stage the data obtained by permuting the original sequence of symbols is processed, usually using the same process as in the first stage. The data are processed in parallel, requiring that the data be stored in several memories and accessed in parallel for the respective stage.

However, parallel processing often causes conflicts. If two or more elements or sets of data that are required to be accessed in a given cycle are in the same memory, they are not accessible in parallel. Consequently, the problem becomes one of organizing access to the data so that all required data are in different memories and can be simultaneously accessed in each of the processing stages.

Consider a one dimensional array of data, $DATA[i]=d\_i$, where $i=0, 1, \ldots, NUM-1$. Index $i$ is also called a global address. If two interleaver tables, $I\_0$ and $I\_1$, have the same size with N rows and p columns, all indices or global addresses $0, 1, \ldots, NUM-1$ can be written to each of these tables in some order determined by two permutations. A process of data updating is controlled by a processor, whose commands have the form COM=(TABLE, ROW, OPERATION), where TABLE is $I\_0$ or $I\_1$, ROW is a row number, and OPERATION is a read or write operation.

Figure 1:
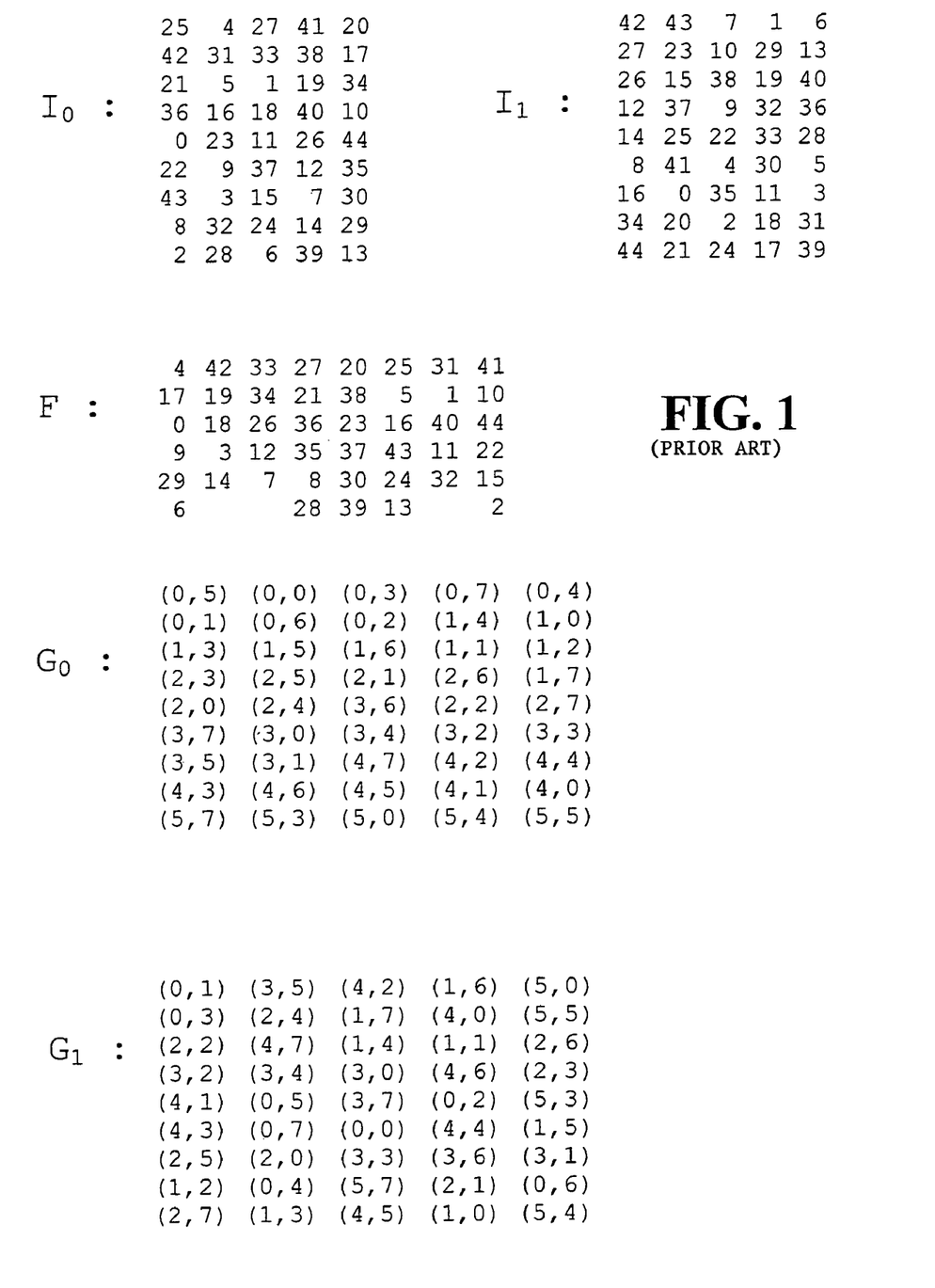
FIGS. 1 and 2 are illustrations useful in explaining certain principles of memory mapping for parallel turbo decoding.

FIG. 1 illustrates an example of interleaver tables $I\_0$ and $I\_1$. A command COM=($I\_0$,0, READ) means that row $r\_0=(25,4,27,41,20)$ is taken from table $I\_0$, and then data DATA[25], DATA[4], DATA[27], DATA[41], DATA[20] are read from the array DATA. In the case of command COM=($I\_1$,3, WRITE), the processor takes global addresses from row $r\_3=(12,37,9,32,36)$ in table $I\_1$, and writes some updated data $d\_new\_0, d\_new\_1, d\_new\_2, d\_new\_3, d\_new\_4$, into array DATA at these global addresses, that is, the processor updates (writes) data in the array, DATA[12]=$d\_new\_0$, DATA[37]=$d\_new\_1$, DATA[9]=$d\_new\_2$, DATA[32]=$d\_new\_3$, DATA[36]=$d\_new\_4$.

During the process of turbo decoding the processor performs a sequence of commands over data in the array DATA. The aforementioned Andreev et al. application describes a decomposer for parallel decoding using n single port memories $MEM\_0, \ldots, MEM\_(n-1)$, where n is the smallest power of 2 that is greater than or equal to N and N is the number of rows in tables $I\_0$ and $I\_1$. The Andreev et al. technique creates a table F that represents each memory in a column, such as $MEM\_0, \ldots, MEM\_7$ shown in FIG. 1, and a global address at each memory address addr in the memory. Two tables $G\_0$ and $G\_1$, which are the same size as tables $I\_0$ and $I\_1$, contain entries in the form (addr, mem) that points to memory MEM\_mem and to the address addr related to the memories depicted in table F.

Figure 2:
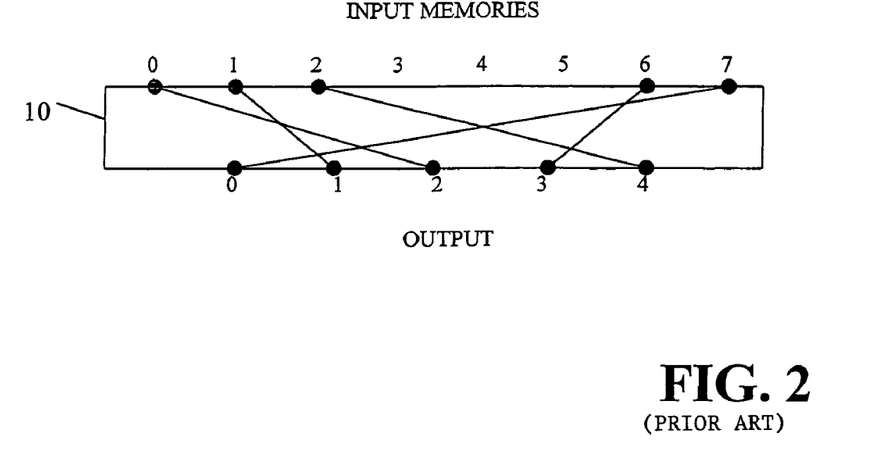

Consider the processor command COM=($I\_0$, 0, R). Row number 0, $R\_0$=(0,5), (0,0), (0,3), (0,7), (0,4), is taken from table $G\_0$ and the processor simultaneously reads $$\left.\begin{array}{l}\text{memory MEM\_5 at its address 0,}\\ \text{memory MEM\_0 at its address 0,}\\ \text{memory MEM\_3 at its address 0,}\\ \text{memory MEM\_7 at its address 0,}\\ \text{memory MEM\_4 at its address 0.}\end{array}\right\} \{*\}$$

As shown in table F, MEM\_5 (sixth column of table F), address 0 (first row), contains the global index 25, MEM\_0, addr\_0 contains index 4, etc. Table F thus provides a correspondence between global addresses (array indices) and local addresses (memory addresses). Thus, $\{*\}$ means that the read operation is simultaneously performed with global addresses 25,4,27,41,20, as it should be. $\{*\}$ also shows that after reading the memories, the global addresses must be matched to the local addresses.

FIG. 2 illustrates a multiplexer 10 that transposes the global addresses or indices from a natural order to a permuted order. Thus, in FIG. 2 the index for the 0 data element (value) of the permutation is read from MEM\_5, the index for the 1 value is read from MEM\_0, etc. Thus, a selection of required values is output from the memories and a permutation of those values is performed by multiplexer 10.

SUMMARY OF THE INVENTION

The present invention is directed to a global routing multiplexer that is capable of selecting p values among n given values and then make a permutation of them according to a given permutation of the length p, while both operations are performed dynamically, i.e. during execution. The global routing multiplexer according to the present invention is implemented in an integrated circuit in minimal chip area and without degrading timing characteristics.

In one embodiment of the invention, a routing multiplexer system provides p outputs based on a selected permutation of p inputs. Each module of an array of modules has two inputs, two outputs and a control input. Each module is arranged to supply the inputs to the outputs in a direct or transposed order based on the control input. A first p/2 group of the modules is coupled to the p inputs and a last p/2 group of the modules is coupled to the p outputs. A memory contains a plurality of control bit tables each containing bit values in an arrangement based on a respective permutation. The memory is responsive to the selected permutation to supply bits from a respective control bit table to the respective modules.

In some embodiments, the multiplexer system is embodied in an integrated circuit chip and is used to map p input memories for parallel turbo decoding. Map inputs couple an output of each memory to respective ones of the inputs of the first group of the modules, and map outputs are coupled to respective ones of the outputs of the last group of the modules.

In another embodiment of the invention, a control bit table for the routing multiplexer is formed by defining the selected permutation having length n, where n≧p. First and second groups of vertices are identified, each containing alternate vertices of a graph of the selected permutation. First and second permutations are calculated based on the respective first and second groups of vertices. The control bit table is formed based on the first and second permutations and on the vertices of the graph of the selected permutation.

DETAILED DESCRIPTION OF THE PREFERRED EMBODIMENTS

A control bit table T is constructed for each row of tables G_0 and G_1 (FIG. 1). The control bits are applied to control inputs of a global routing multiplexer to create a multiplexer in the form of that depicted in FIG. 2. The computation of control bit tables for all rows from both tables G_0 and G_1 (as far as the computation of the tables F, G_0 and G_1 themselves) can be done in advance and the tables can be stored in an auxiliary memory. The control bit table T (written as a vector) computed for the row R_i of the table G_0 is stored in the auxiliary memory at an address (0,i), and for the row R_i from the table G_1 at an address (1,i) respectively, where i=0, 1, 2, . . . , N−1.

Figure 3:
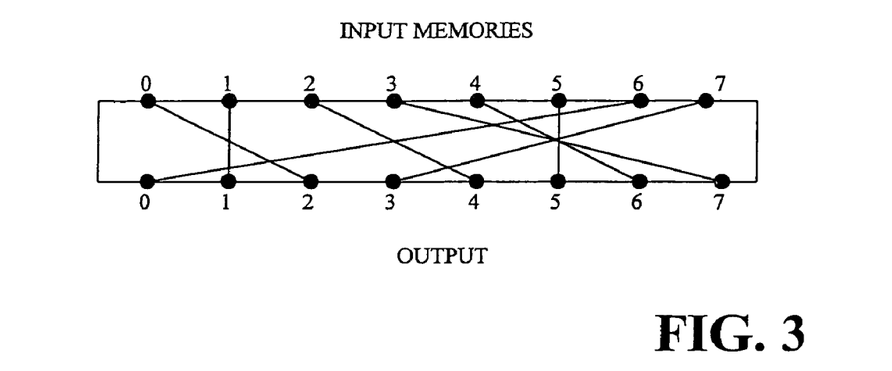
FIGS. 3 and 4 are illustrations useful in explaining certain principles of a global routing multiplexer according to the present invention.

For the purposes of explanation, n is the number of single-port memories supplying a single element or value and p is the length, or number of values, of the permutation. Consider first a global routing multiplexer for n>p, herein designated GR_MUX(n.p). Multiplexer GR_MUX(n.p) is transformed into multiplexer GR_MUX(n.n) that realizes a permutation of length n. This can be done by adding n−p fictive outputs to the right side of the GR_MUX(n.p) to change the initial permutation of length p to the larger permutation of the length n. For example, a multiplexer GR_MUX(8.5) (FIG. 2) is converted to a multiplexer GR_MUX(8.8) by adding three fictive outputs and coupling them to the unnecessary input memories MEM_3, MEM_4 and MEM_5. See FIG. 3. After completion of synthesis these extra outputs (and unneeded cells connected with them and associated control bits) can be removed from the chip.

Figure 4:
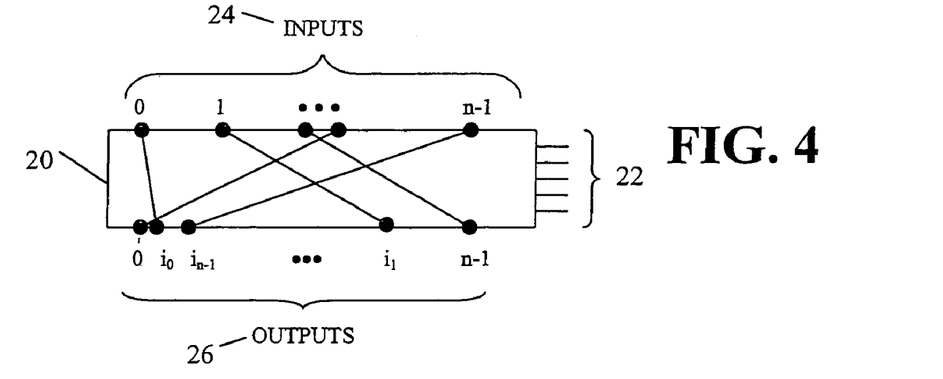

FIG. 4 illustrates a global routing multiplexer 20 that has the capability to realize any permutation of a given length of inputs, namely to interconnect the inputs with outputs in some specified, permuted order. Multiplexer 20 has control inputs 22 for control bits as well as n inputs 24 and n outputs 26 to be interconnected in an order specified by the control bits at inputs 22. As shown in FIG. 4, inputs 0, 1, . . . , n−1 are transformed to outputs 0, 1, . . . , n−1 in a permuted order, which in the example of FIG. 4 shows input 0 connected to output 1, input n−1 connected to output 2, etc.

The control bits permit reconfiguration, or adjustment, of the internal structure of the multiplexer 20. More precisely, for any permutation P of inputs 24 there exists a set of control bits that can be applied to control inputs 22 to configure multiplexer 20 to perform permutation P and provide outputs 26 based on that permutation. In one sense, the multiplexer appears as a programmable multiplexer that is programmable by the set of control bits; in another sense, the multiplexer appears as a universal multiplexer to realize any permutation of a given length.

The control bits that form the multiplexer's "program" may be pre-computed and written into an external memory module. The control bits are read from that memory and programmatically switch the multiplexer to the required configuration for the desired permutation. In one form of the invention, the control bits are arranged in control bit tables for each permutation, which are stored in the memory. The flexibility of the programmable multiplexer makes it especially useful in such applications that make use of field programmable gate arrays (FPGAs), programmable logic modules (PLM), etc.

For an understanding of global routing multiplexer 20, it is first necessary to understand the coding of permutations, and particularly the application of coloring and decomposing techniques used in the recursive construction of the control bit tables.

Coloring of Permutations

Consider permutations of n numbers from the set $\{0, 1, \ldots, n-1\}$. Permutation P, comprising $P(0)=i\_0$, $P(1)=i\_1, \ldots, P(n-1)=i\_(n-1)$, is denoted by an ordered n-tuple $(i\_0, i\_1, \ldots, i\_(n-1))$, where $i\_0, i\_1, \ldots, i\_(n-1)$ are numbers $0, 1, \ldots, n-1$ written in some order. Number n is the permutation length. For example, P=(7,1,0,6,2,5,3,4) is a permutation of the natural order (0,1,2,3,4,5,6,7) having a length n=8.

Figure 5:
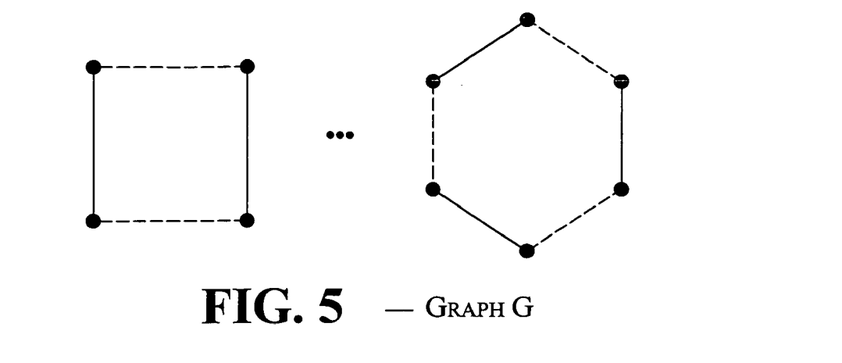
FIGS. 5-12 are illustrations useful in explaining development of control bit tables used in a global routing multiplexer according to the present invention.

To color permutation $P=(i\_0, i\_1, \ldots, i\_(2m-1))$ of even length 2m, consider a graph G with 2m vertices corresponding to numbers 0, 1, . . . , 2m−1. Alternate m edges (0,1), (2,3), . . . of this graph are formed by connecting vertices 0 and 1, . . . , 2 and 3, etc. These edges are referred to as black edges, and their construction does not depend on the permutation itself. Again using permutation P, yet another alternate m edges (1,2), (3,4), . . . are formed by connecting vertices 1 and 2, . . . , 3 and 4, etc., and are referred to as red edges. As far as P is a permutation, each vertex i is incident to exactly 1 black and 1 red edge. This implies that graph G is a union of several cycles each of even length (see FIG. 5 where red edges are depicted in dashed lines and black edges are depicted in solid lines).

Figure 6:
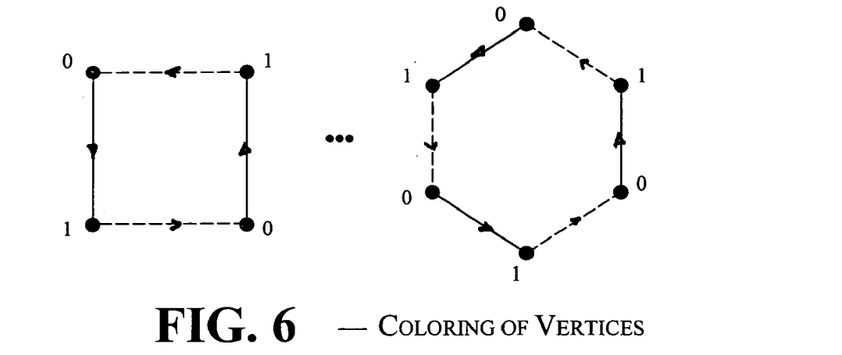

By moving along these cycles in some direction, each passing vertex i is colored in the outgoing edge's color (see FIG. 6, where black vertices are denoted by 0 and red ones are denoted by 1). The color of a vertex i is designated as Color(i).

Figure 7:
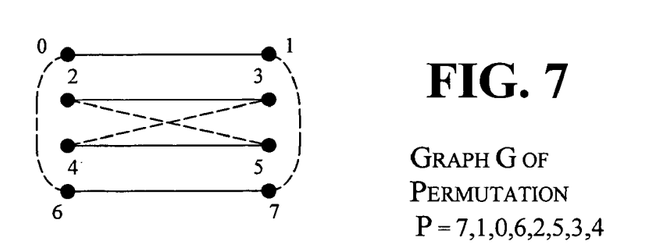
Figure 8:
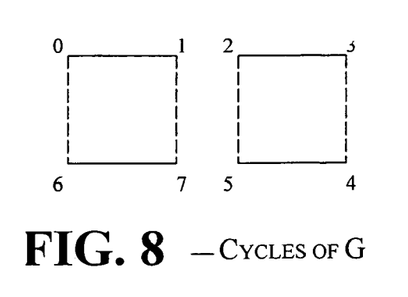
Figure 9:
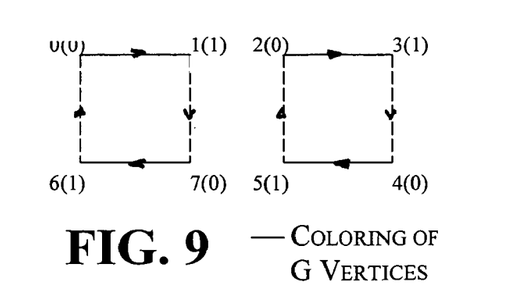

FIG. 7 illustrates a graph G for permutation P=(7,1,0,6, 2,5,3,4) with red and black edges. Thus the black edges are (0,1), (2,3), (4,5) and (6,7) and the red edges are (1,2), (3,4), (5,6) and (7,0), and are not dependent on permutation P. As illustrated in FIG. 8, the graph of FIG. 7 reduces to two cycles which leads, for instance, to the coloring of graph's vertices shown in FIG. 9, where colors 0 (black) and 1 (red) are depicted in brackets adjacent the vertices.

Decomposing of Permutations

Two new permutations P_0 and P_1, each of length m, can be extracted from a correctly colored graph G of permutation P of length 2m. From some starting point in the graph G, the m black numbers are recorded in a row L_0 and assigned j_0, . . . , j_(m−1), in the order of passing of the respective black vertices. Similarly, the m red numbers are recorded in a row L_1 and assigned k_0, . . . , k_(m−1), in the order of passing of the respective red vertices. Thus, row L_0=(j_0, . . . , j_(m−1)) and row L_1=(k_0, . . . , k_(m−1)), and each is in the order of the permutation. Stated another way, one of the two numbers defining an edge, (0,1), (2,3), . . . , (2m−2, 2m−1), is black and goes to row L_0, and the other number is red and goes to row L_1.

The numbers of both rows L_0 and L_1 are divided (as integers) by 2, and the result is rounded down to j and k, respectively: dividing 2j and 2j+1 by 2 results in j and dividing 2k and 2k+1 by 2 results in k. As a result, two permutations P_0=(j_0/2, . . . , j_(m−1)/2) and P_1=(k_0/2, . . . , k_(m−1)/2) are derived by dividing the numbers in rows L_0 and L_2 by 2 and rounding down.

This is exemplified in FIG. 7, where permutation P=(7(0),1(1),0(0),6(1),2(0),5(1),3(1),4(0)) provides rows L_0=(7,0,2,4) and L_1=(1,6,5,3). Two permutations P_0=(3,0,1,2) and P_1=(0,3,2,1) of numbers {0,1,2,3} are derived by dividing the numbers of each row by 2 (rounded down).

Construction of Control Bit Tables T(P)

Though control bit tables may be built for permutations of arbitrary length n, what follows is a description of a control bit table for permutations where length n is a power of 2.

Control bit table T(P) for a given permutation P of a length n has a size $(2k-1) \times 2^{k-1}$ and consists of 2k−1 rows each having length equal to $2^{k-1}$, where $n=2^k$ and k>0. This table consists of ones and zeroes and is built recursively for a given permutation P. Consider control bit tables T constructed for permutation P having a length n=8. In this case, k=3, and table T will have a size of 5×4 (5 rows each having a length of 4 bits).

For k=1 there are two permutations only, namely (0,1) and (1,0). For the first permutation T=(0) and for the second T=(1).

For k>1, the permutation P of length $n=2^k$ can be colored as described above, and decomposed into two permutations P_0 and P_1, each having a length $2^{k-1}$. Control bit tables T_0 and T_1 are then constructed for permutations P_0 and P_1, respectively. Control bit tables T_0 and T_1 may be constructed using global permutation networks described at pp. 309-311 in MODELS OF COMPUTATION—Exploring the Power of Computing, by John E. Savage, Addison-Wesley (1998), incorporated herein by reference. One of the two colors, black for instance, is chosen as the leading color, designated label_color. Thus, if black is the leading color, label_color=0.

A differently colored pair of numbers (i,j) is "well ordered" if Color(i)=label_color. Otherwise, the pair is "disordered". The well ordered pairs are labeled with a label index of 0 and disordered pairs are labeled with a label index of 1.

For a given order of elements, pairs (i_0,i_1), . . . , (i_(n−2),i_(n−1)) are labeled to determine label indices in a row S of length $2^{k-1}$. The first term of each pair identifies whether the pair is well ordered or disordered, thereby defining the bits of the row S. A first row, S_0, is created based on the order of input memories to the multiplexer (which is usually the natural order of the input memories). S_0=(a_0, . . . , a_(m−1)), where $m=2^{k-1}$ and a_i is a label index of the pair (2i, 2i+1). In the example, the order of memory inputs to the multiplexer is the natural order and is 0,1,2,3,4,5,6,7. See FIG. 3. Consequently, S_0 is derived from the pairs (0,1), (2,3), (4,5), (6,7).

For a given permutation P=(i_0, . . . , i_(n−1)) pairs (i_0,i_1), . . . , (i_(n−2),i_(n−1)) determine the row of label indices S_1=(b_0, . . . , b_(m−1)). Thus permutation P=(7, 1,0,6,2,5,3,4) provides the pairs (7,1), (0,6), (2,5), (3,4). The first term of each pair indicates which among the pairs is well ordered or disordered, thereby defining the bits of rows S_0 and S_1.

Figure 10:
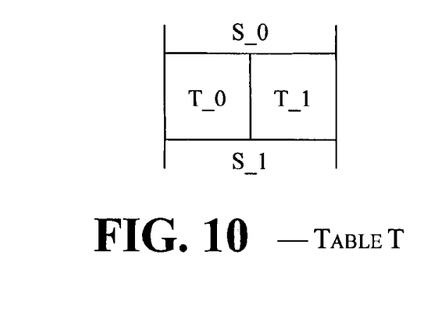
Figure 11:
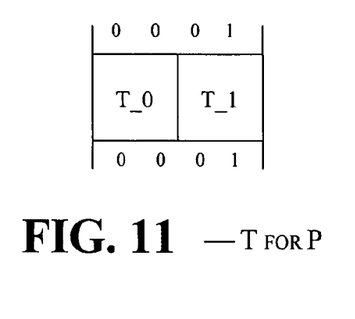
Figure 12:
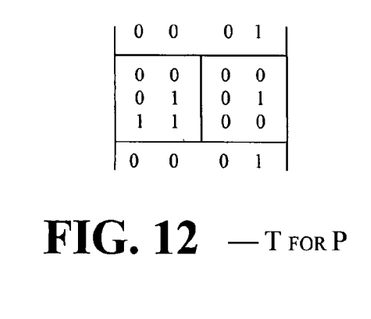

With reference to FIGS. 10-12, for the above colored and decomposed permutation P=(7,1,0,6,2,5,3,4) only last pair (6,7) of the natural pairs (0,1), (2,3), (4,5), (6,7) is disordered, so line S_0 of label indices will be S_=(0,0,0,1). More particularly, with reference to FIG. 9, each of the pairs (0,1), (2,3) and (4,5) has its first number colored black (0). Therefore, these pairs are well ordered (value=0). However the pair (6,7) has its first number (6) colored red (1), meaning it is disordered (value=1). In a similar manner, pairs (7,1), (0,6), (2,5) and (3,4) of permutation P provide S_1=(0,0,0,1).

This leads to table T (FIG. 11) where T_0 and T_1 are 3×2 control bit tables for permutation P_0 and P_1. Tables T_0 and T_1 are concatenated, and rows S_0 and S_1 are inserted as the first and last rows of the table, resulting in the control bit table T for the permutation P, as shown in FIG. 12.

Figure 13:
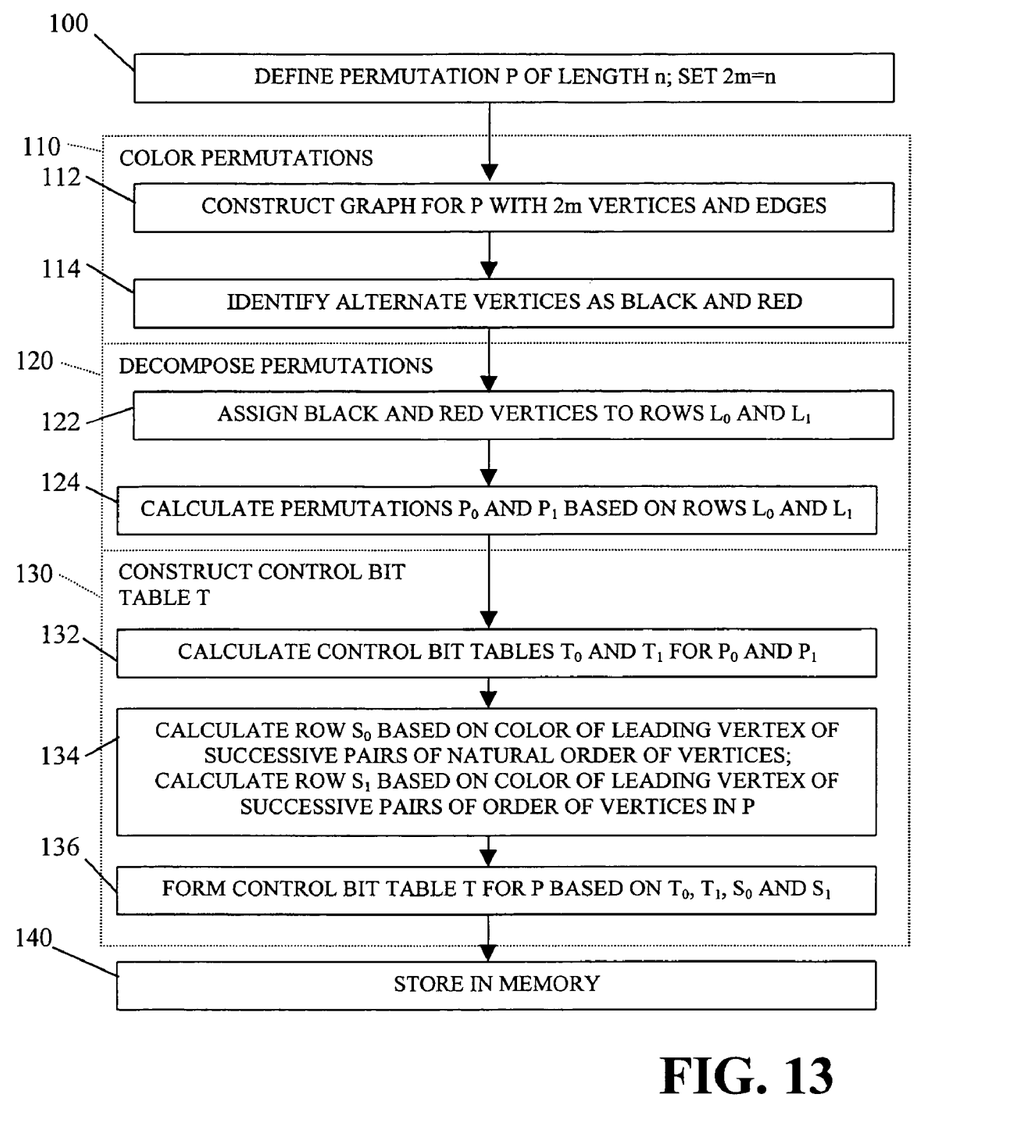
FIG. 13 is a flowchart of a process of construction of a control bit table for a global routing multiplexer according to an embodiment of the present invention.

The process of building control bit tables for permutations can be considered as a coding permutations of length $n=2^k$ by binary tables of size $(2k-1) \times 2^{k-1}$, where k>0. As shown in FIG. 13, the process commences at step 100 with the selection of a permutation P of length n, where n is an even number equal to 2m.

Permutation P is colored at step 110. More particularly, at step 112 a graph for permutation P is constructed having 2m vertices and edges. The order of the vertices is the order of the permutation, as shown in FIG. 7. At step 114, alternate vertices are assigned different status, such as colors black and red. As previously explained, one technique to accomplish this is to color alternate edges black and red and assign each vertex the same color as its outgoing edge.

At step 120, permutation P is decomposed. More particularly, at step 122 the red vertices are assigned to row L_0 and the black vertices are assigned to row L_1, both in the same order as they appear in the permutation. At step 224, permutations P_0 and P_1 are calculated by dividing each value appearing in rows L_0 and L_1, respectively, by 2, rounding down. In the example given where L_0=(7,0,2,4) and L_1=(1,6,5,3), P_0=(3,0,1,2) and P_1=(0,3,2,1).

The control bit table T is constructed at step 130. More particularly, at step 132 tables T_0 and T_1 are constructed for each permutation P_0 and P_1, such as in the manner described in the aforementioned Savage book. At step 134, row S_0 is constructed based on the color of the leading vertex of vertex pairs in the natural order of vertices, and row S_1 is constructed based on the color of the leading vertex of vertex pairs in permutation P. If the color indicates the pair is well ordered, as evidenced in the example by a leading black vertex in the pair, the bit in the row is one binary value, such as 0. If the color indicates the pair is disordered, as evidenced in the example by a leading red vertex in the pair, the bit is the other binary value, such as 1. Hence, in the example, S_0 is (0,0,0,1) and S_1 is (0,0,0,1).

Control table T is constructed at step 136 as a concatenation of T_0 and T_1, and rows S_0 and S_1 are inserted as the top and bottom rows of table T. See FIG. 12. At step 140, table T is stored in memory, such as memory 50 in FIG. 16.

The logarithm (on base 2) of the number of all permutations of the length n, log n!, is asymptotically equal to n log $n=2^k k$ which is asymptotically equal to the size of control bit table T. This means that coding permutations using the control bit tables turns out to be an optimal one.

The choice of label_color is arbitrary and the choosing of another color (black instead of red or vice versa) results in a dual control bit table construction. Moreover, at each step of induction the choice of label_color can be changed so that different control bit tables may be used for the same permutation.

Construction of Global Routing Multiplexer 20

Figure 14:
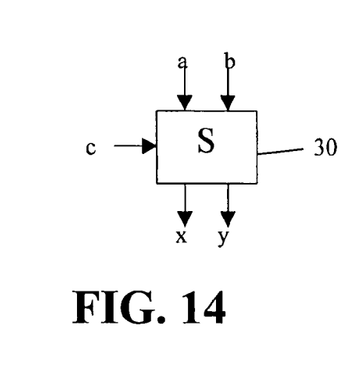
FIG. 14 is a block diagram of a module used in construction of a global routing multiplexer according to the present invention.

FIG. 14 illustrates a basic module 30 having two inputs a and b, a control input c and two outputs x and y. Module 30 operates to supply inputs a and b to outputs x and y, in either direct or transposed order, depending on the value of input c. If c=0 then module 30 does not change the order of the inputs, and x=a and y=b. If c=1, then module S performs a transposition of the inputs, and x=b and y=a. Formally, the functioning of the module 30 is determined by the following system of Boolean equations:

$$x=(\sim c)\&a|c\&b,$$

$$y=c\&a|(\sim c)\&b,$$

where ~, & and | are Boolean operations of negation, conjunction and disjunction, respectively.

Figure 15:
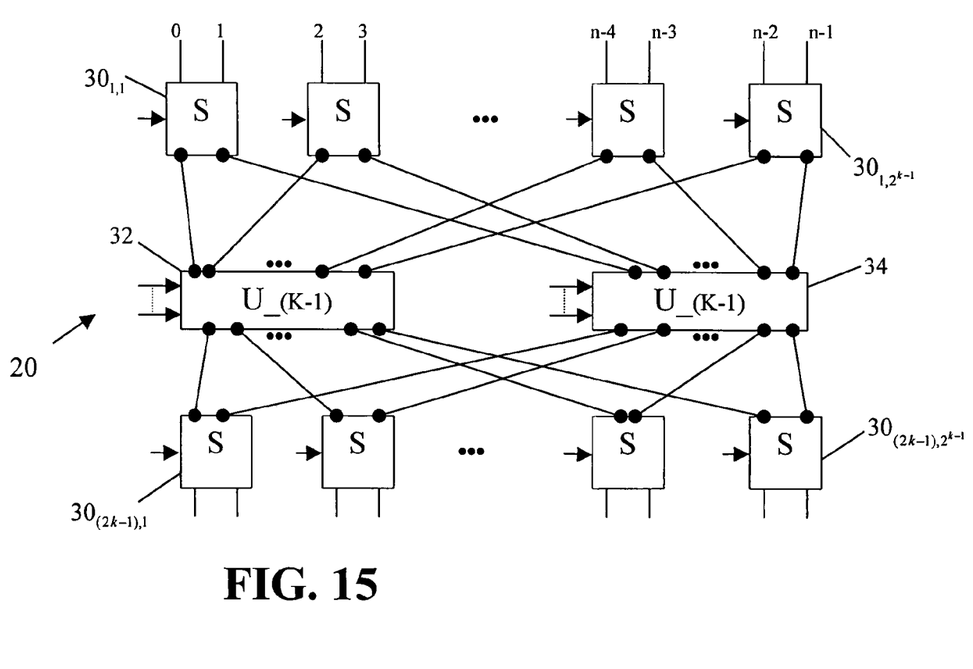
FIG. 15 is a block diagram of a global routing multiplexer according to an embodiment of the present invention.

As shown in FIG. 15, global routing multiplexer 20 is constructed recursively using $(2k-1)\times 2^{k-1}$ modules 30 arranged in 2k-1 horizontal rows such that each row contains $2^{k-1}$ modules 30. Hence, modules 30 are arranged in the same array organization as control bit table T_k. Hence, in FIG. 15, each module 30 is designated with a row and position designation between 30_(1,1) and 30_((2k-1),$2^{k-1}$) designating rows between 1 and 2k-1 and positions between 1 and $2^{k-1}$. For simplicity, modules 32 and 34 designate groups of modules 30 arranged in the same manner.

Figure 16:
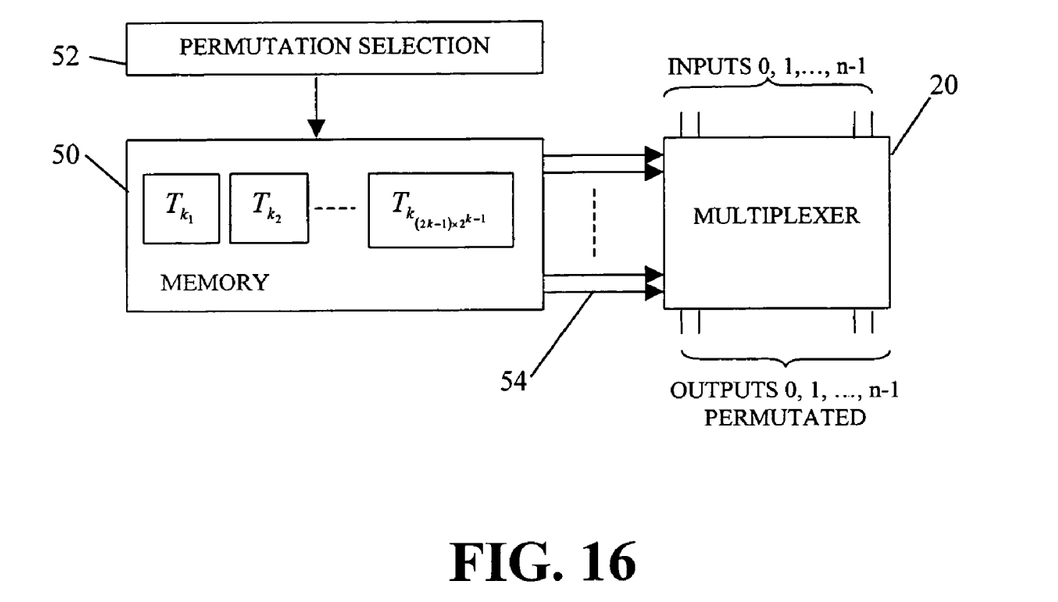
FIG. 16 is a block diagram of the multiplexer shown in FIG. 15 coupled to a memory containing control bit tables constructed by the process of FIG. 13.

FIG. 16 illustrates a memory 50 containing a plurality of control bit tables T_k have a construction illustrated in FIG. 12. Memory 50 is coupled to global routing multiplexer 20 to decode a given permutation P selected by permutation selector 52 using the control bit table T_k for the selected permutation P. More particularly, for a given permutation P, control bits from a corresponding control bit table T_k in memory 50 are applied through bus 54 to corresponding control inputs c (FIG. 14) of corresponding modules 30 of global routing multiplexer 20. Hence, a bit from row i, column j of table T_k is applied to the control input c of the module 30 located at row i, column j of multiplexer 20. Thus, numbers 0, 1, . . . , n-1 applied to the inputs of global routing multiplexer 20 will realize some permutation based on the control bits from the table T_k corresponding to the permutation.

While the present invention has been described in connection with permutations of length n, the global routing multiplexer 20 according to the present invention, and its attendant control bit tables, can be constructed for shorter permutations of length p, where p<n. More particularly, as described in connection with FIGS. 2 and 3, a multiplexer of length n can be designed using n-p fictive outputs (and inputs, if necessary) and the unnecessary outputs and modules 30 are removed after synthesis. The integrated circuit forming multiplexer 30 is thus reduced in size to accommodate permutations of length p. Since control bit tables are not needed for permutations affected by the expansion of the multiplexer (i.e., permutations affecting outputs greater than p), those tables need not be even constructed, or if constructed need not be placed in memory 50.

Thus the present invention provides a multiplexer system having an array of modules 30 arranged in 2k-1 rows, with the first row containing p/2 modules coupled to the input memories being mapped and the last row containing p/2 modules forming the output of the multiplexer system, where $p=2^k$.

It is clear (and can be proven by induction), that if table T is built as the control bit table for permutation P, and global routing multiplexer 20 is built for table T, then global routing multiplexer 20 realizes exactly permutation P, P→T→30→P. Multiplexer 20 has 2k-1 horizontal rows of modules 30. Consequently, its depth is logarithmic, which is an optimal (by order) depth.

Although the present invention has been described with reference to preferred embodiments, workers skilled in the art will recognize that changes may be made in form and detail without departing from the spirit and scope of the invention.

What is claimed is:

1. A parallel turbo decoder comprising:
  an interleaver memory comprising n interleaver memory outputs;
  a routing multiplexer, comprising:
    n multiplexer inputs coupled to the n interleaver memory outputs;
    p multiplexer outputs based on a selected permutation of the n multiplexer inputs, where p and n are integer variables and n≧p; and
    a plurality of modules arranged in an array of interconnected rows, each module having first and second inputs, first and second outputs and a control input and arranged to supply signals at the first and second inputs to the first and second outputs in a direct or transposed order based on a value of a control bit at the control input, the array comprising a first row formed by a first group of p/2 of the modules of which the first and second inputs are each coupled to a respective one of the n multiplexer inputs and a last row formed by a second group of p/2 of the modules of which the first and second outputs are each coupled to a respective one of the p multiplexer outputs; and
  a memory containing a plurality of control bit tables each containing a plurality of control bits in an arrangement based on a respective permutation, the memory being responsive to the selected permutation to supply the plurality of control bits of the control bit table that corresponds to the selected permutation to respective control inputs of the modules.

2. The parallel turbo decoder of claim 1, wherein each control bit table contains rows each containing a plurality of the control bits, the memory supplying a j-th bit at an i-th row of a selected control bit table to the corresponding j-th module of the i-th row of the array.

3. The parallel turbo decoder of claim 2, wherein there are at least $(2k-1)\times 2^{k-1}$ modules and at least $(2k-1)\times 2^{k-1}$ control bits and the array of modules and each control bit table has 2k-1 rows, where $p=2^k$ and k>0.

4. The parallel turbo decoder of claim 1, wherein there are at least $(2k-1)\times 2^{k-1}$ modules and at least $(2k-1)\times 2^{k-1}$ bits, where $p=2^k$ and k>0.

5. An integrated circuit chip containing a circuit for mapping up to p memories for parallel turbo decoding, wherein p is an integer variable, the circuit comprising:
   a routing multiplexer having:
   a plurality of modules arranged in an array of interconnected rows, each module having first and second inputs, first and second outputs and a control input and arranged to supply signals at the first and second inputs to the first and second outputs in a direct or transposed order based on a value of a control bit at the control input, the array comprising a first row formed by a first group of p/2 of the modules, of which the first and second inputs are each coupled to a respective one of the memories, and a last row formed by a second group of p/2 of the modules, of which each of the first and second outputs form a respective map output, and
   a permutation memory containing plurality of control bit tables each containing a plurality of the control bits in an arrangement based on a respective permutation; and
   a permutation selection device coupled to the permutation memory for operating the permutation memory to select one of the control bit tables to supply the control bits of that table to the control inputs of the modules.

6. The integrated circuit chip of claim 5, wherein each row contains p/2 modules, and each control bit table contains rows each containing p/2 control bits, the memory supplying a j-th bit at an i-th row of a selected control bit table to the corresponding j-th module of the i-th row of the array.

7. The integrated circuit chip of claim 6, wherein there are at least $(2k-1)\times 2^{k-1}$ modules and at least $(2k-1)\times 2^{k-1}$ control bits and the array of modules and each control bit table has 2k-1 rows, where $p=2^k$ and k>0.

8. The integrated circuit chip of claim 7, wherein the first group of modules comprises the i=1 row of the away and the second group of modules comprises the i=2k-1 row of the array.

9. The integrated circuit chip of claim 5, wherein there are at least $(2k-1)\times 2^{k-1}$ modules and at least $(2k-1)\times 2^{k-1}$ bits, where $p=2^k$ and k>0.

10. A routing multiplexer system comprising:
   n multiplexer inputs;
   p multiplexer outputs based on a selected permutation of the n multiplexer inputs, where p and n are integer variables and $n \geq P$;
   a plurality of modules arranged in an array of interconnected rows, each module having first and second inputs, first and second outputs and a control input and arranged to supply signals at the first and second inputs to the first and second outputs in a direct or transposed order based on a value of a control bit at the control input, the away comprising a first row formed by a first group of p/2 of the modules of which the first and second inputs are each coupled to a respective one of the n multiplexer inputs and a last row formed by a second group of p/2 of the modules of which the first and second outputs are each coupled to a respective one of the p multiplexer outputs; and
   a memory containing a plurality of control bit tables, each control bit table containing rows, each containing a plurality of control bits in an arrangement based on a respective permutation, the memory being responsive to the selected permutation to supply a j-th bit at an i-th row of a selected control bit table that coffesponds to the selected permutation to the coffesponding control input of the j-th module of the i-th row of the array.

\* \* \* \* \*